United States Patent [19]

Terasawa et al.

[11] 4,354,121
[45] Oct. 12, 1982

[54] FIELD CONTROLLED THYRISTOR CONTROL CIRCUIT WITH ADDITIONAL FCT IN REVERSE BIAS CIRCUIT

[75] Inventors: Yoshio Terasawa, Katsuta; Kenji Miyata, Hitachi; Saburo Oikawa, Hitachi; Susumu Murakami, Hitachi; Masahiro Okamura, Hitachi; Takuzo Ogawa, Hitachi, all of Japan

[73] Assignee: Hitachi, Ltd., Tokyo, Japan

[21] Appl. No.: 284,794

[22] Filed: Jul. 10, 1981

Related U.S. Application Data

[63] Continuation of Ser. No. 14,587, Feb. 23, 1979, abandoned.

[30] Foreign Application Priority Data

Feb. 23, 1978 [JP] Japan ................................. 53-19064

[51] Int. Cl.³ ............................................ H03K 17/60
[52] U.S. Cl. ................................ 307/252 C; 307/283; 307/284; 307/287; 307/305; 357/22; 357/38
[58] Field of Search ................... 307/252 C, 305, 283, 307/284, 287; 357/22, 38

[56] References Cited

U.S. PATENT DOCUMENTS

3,821,565 6/1974 Horinaga ........................ 307/252 C
4,037,245 7/1977 Ferro ..................................... 357/38
4,060,821 11/1977 Houston et al. ...................... 357/38

Primary Examiner—Joseph E. Clawson, Jr.
Attorney, Agent, or Firm—Antonelli, Terry & Wands

[57] ABSTRACT

A switching control circuit includes a first field controlled thyristor having a gate and a cathode between which a backward bias voltage source and a second field controlled thyristor are connected in series. Conduction of the second field controlled thyristor is controlled by controlling a voltage applied across the gate and the cathode, thereby to control conduction of the first field controlled thyristor. A large load current can be positively and safely turned on and off by a relatively small control current or voltage.

15 Claims, 18 Drawing Figures

FIELD CONTROLLED THYRISTOR CONTROL CIRCUIT WITH ADDITIONAL FCT IN REVERSE BIAS CIRCUIT

This is a continuation of application Ser. No. 014,587, filed Feb. 23, 1979 now abandoned.

BACKGROUND OF THE INVENTION

1. Field of the Invention

The present invention relates to a switching control circuit for a field controlled thyristor and in particular concerns a field controlled thyristor control circuit which is capable of switching on and off a large load current with a relatively small control signal.

2. Description of the Prior Art

The field controlled thyristor is a semiconductor switching element including a semiconductor region of one conductivity type (referred to as the gate region) formed locally in one of the regions of a pn-junction diode that has the other conductivity type and a gate electrode electrically contacted to the gate region.

In the field controlled thyristor of the structure described above, when the junction between the region of the other conductivity type and the gate region is biased backwardly, the forward current flow through the pn-junction diode is cut off (turn-off) due to a depletion layer formed in the region of the other conductivity type. On the other hand, when the backward bias is removed, the depletion layer will disappear thereby to allow the forward current to flow (turn-on). In this manner, the field controlled thyristor exhibits a switching function. As compared with the hitherto known semiconductor switching elements such as transistors, thyristors or the like, the field controlled thyristor has a significantly reduced turn-on time and additionally enjoys an enhanced di/dt capability upon turn-on operation. Further, means for turning off the field controlled thyristor can be implemented in a much improved manner.

Figure 1:
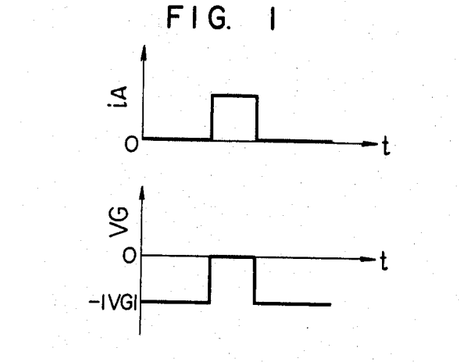
FIG. 1 illustrates graphically a relationship between an anode current and a gate voltage of a field controlled thyristor FCT.

FIG. 1 shows a phase relationship between an anode or load current iA and a gate voltage $V_G$ of a field controlled thyristor (hereinafter referred to also as FCT in abridgement). When a backward bias voltage is applied to the gate electrode of the FCT, e.g. a negative gate voltage $-V_G$ is applied in the case of the FCT having a P-type gate region, no anode current can flow through the FCT provided that the absolute value of the gate voltage $|V_G|$ is not smaller than a predetermined value. When the gate voltage $|V_G|$ is lowered below the predetermined value, the anode current is allowed to flow and continues to flow unless the negative gate voltage of the prescribed value is applied. Upon application of the negative gate voltage, the anode current will be turned off again.

Typical examples of such an FCT as described above are disclosed in the specifications of U.S. Pat. Nos. 4,037,245 and 4,060,821, for example.

Figure 2:
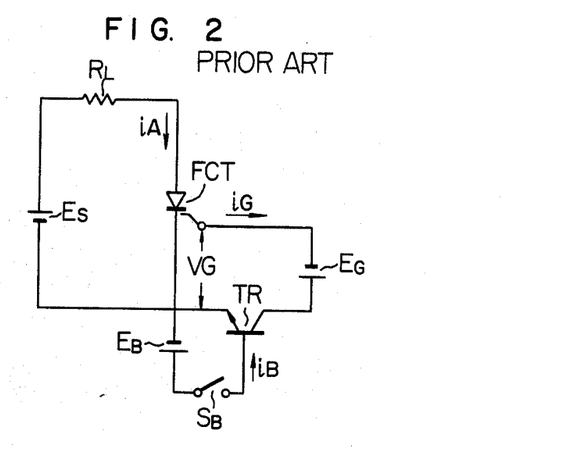
FIG. 2 is a circuit diagram to show a typical example of hitherto known control circuits for FCT'S.
Figure 3:
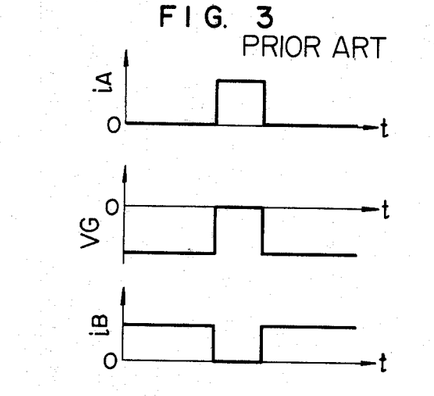
FIG. 3 shows signal waveform diagrams to illustrate operation of the control circuit shown in FIG. 2.

As a method for controlling an FCT, it is conceivable to connect a transistor in series to a backward bias voltage source, as is exemplarily shown in FIG. 2. On the assumption that the FCT concerned has a gate region of P-conductivity type, the control circuit shown in FIG. 2 comprises a series connection of an npn-type transistor TR, a gate voltage source $E_G$, a main power supply source $E_S$ for the field controlled thyristor FCT and a load $R_L$ which are connected between the gate and the anode electrode of FCT as well as a series connection of a base current supply source $E_B$, and a switch $S_B$ inserted between the cathode electrode of FCT and the base electrode of the transistor TR. Operation of this circuit is graphically illustrated in FIG. 3. As will be readily understood, when the switch $S_B$ is turned on, the transistor TR becomes conductive due to the base current iB supplied from the base current supply source $E_B$ thereby to provide a low impedance state, as a result of which the gate voltage VG of the gate voltage source $E_G$ is applied between the gate and the cathode electrode of FCT to turn it off. On the other hand, when the switch $S_B$ is turned off, the transistor TR becomes non-conductive or off to inhibit the application of the gate source voltage VG between the gate electrode and the cathode electrode of FCT. Consequently, FCT is turned on. In this manner, in order to hold FCT in the non-conductive state continuously, it is required to supply constantly the base current to the transistor TR to maintain it in the conductive state. Accordingly, in the applications in which FCT is to be maintained in the off or non-conductive state for a relatively long duration by using a single-shot pulse current of a relatively short duration or pulse current of a relatively low repetition frequency, it becomes necessary to employ the base current source $E_B$ of a relatively large power capacity. Further, the base current to the transistor TR needs to be cut off for making FCT conductive for a relatively short duration. In this connection, it should be noted that the commercially available pulse generators are not generally suited to be used straightforwardly as the base current source in such applications.

Another disadvantage of the control circuit for FCT shown in FIG. 2 may be found in the fact that a transistor having a high over-current capability has to be used for the transistor TR because the anode current iA will flow through the gate circuit of FCT when the anode current iA is turned off. An example of experimental measurement of the anode current and the gate current is graphically illustrated in FIG. 4. As can be seen from this graph, the peak value of the gate current iG will sometimes attain a value substantially equal to the peak value of the anode current iA. It goes without saying that the correspondingly increased gate current iG will also flow through the transistor TR at the time when a large anode current of FCT is cut off. Consequently, a transistor having a high over-current capability is required for the transistor TR. In spite of the requirement described above, the transistors which are commercially available are generally poor in respect of the over-current capability, which provides a difficulty in implementing the control circuit shown in FIG. 2 for practical applications.

SUMMARY OF THE INVENTION

A primary object of the present invention is to provide a control system which is capable of controlling a field controlled thyristor FCT without requiring a control current source of a large power capacity, thereby to obviate the disadvantage of the control circuit such as the one described above in conjunction with FIG. 2.

According to an aspect of the invention, the above and other objects which will become apparent as description proceeds can be attained by using a field controlled thyristor FCT in place of the transistor in FCT control circuit.

Above and other objects, novel features and advantages of the invention will be more clearly understood by examining the following description of the preferred

DESCRIPTION OF THE PREFERRED EMBODIMENTS

Figure 5:
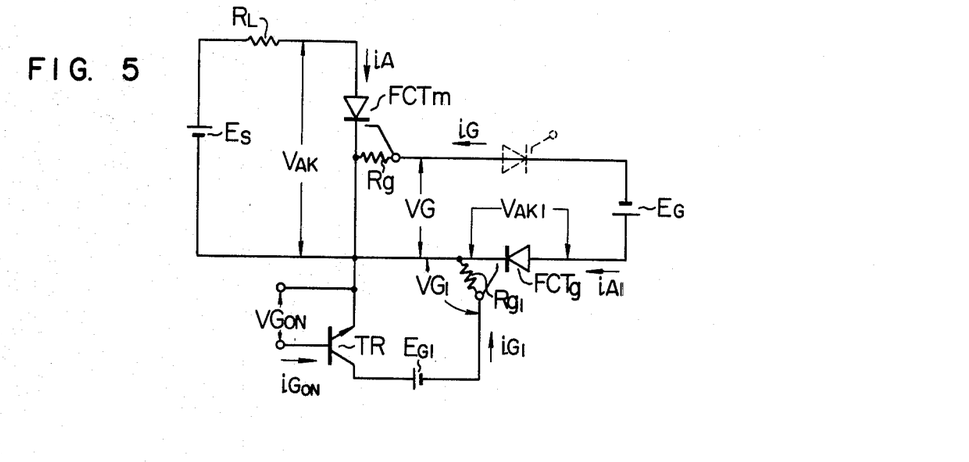
FIG. 5 is a circuit diagram of an FCT control circuit according to an embodiment of the invention.

An FCT control circuit according to an embodiment of the invention is shown in FIG. 5 in which the same reference symbols as those shown in FIG. 2 designate the like parts. As a switching element to control the anode or load current iA flowing through the load $R_L$, a main field controlled thyristor FCT is used, which is referred to also as FCTm. A control FCT denoted by FCTg is connected in series to a negative gate voltage source $E_G$ for FCTm. An npn-transistor TR is connected in series to a gate voltage source $E_{G1}$ for FCTg. When a control voltage $VG_{ON}$ is applied across the base-emitter path of the transistor TR thereby to lower the impedance thereof, the gate source voltage $E_{G1}$ is applied between the gate and the cathode electrode of FCTg, as the result of which FCTg takes a high impedance state. Consequently, the gate current from the gate voltage source Eg for the FCTm is blocked by FCTg. Thus, the absolute value of the gate voltage VG for the FCTm is correspondingly decreased, thereby to inhibit the anode current iA. In this connection, it will be noted that a high impedance of the gate-cathode path of FCTm tends to prevent the absolute value of the gate voltage VG from being lowered sufficiently. With a view to evading such a situation, a resistor Rg is inserted between the gate and the cathode of FCTm to lower the impedance in concern.

Figure 6:
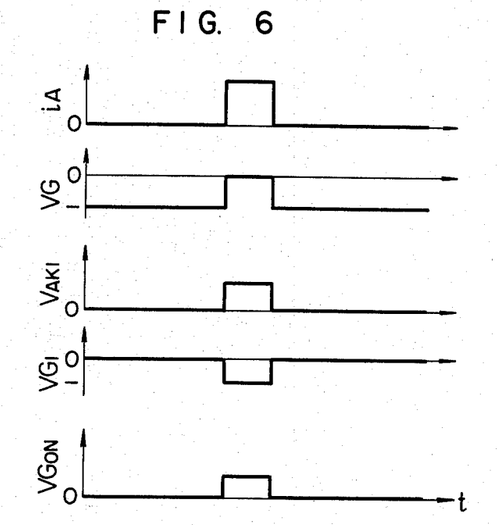
FIG. 6 shows signal waveform diagrams to illustrate operation of the control circuit shown in FIG. 5.

When the control input voltage $VG_{ON}$ applied across the base-emitter path of the transistor TR is set to zero, the transistor TR takes a high impedance state, whereby the gate current from the gate voltage source $E_{G1}$ is blocked by the transistor TR. Consequently, FCTg takes a low impedance state to become conductive. In this case, there may happen that a high impedance between the gate and the cathode of FCTg will prevent the gate current from the gate voltage source $E_{G1}$ from being suppressed adequately by the transistor TR. To dispose of such a condition, a resistor $Rg_1$ is inserted between the gate and the cathode electrodes of FCTg to lower the impedance concerned. With such arrangement, FCTg can take a low impedance state without fail, as the result of which FCTm is brought to the forwardly blocked state under the gate source voltage Eg applied across the gate and the cathode of FCTm thereby to block the anode current iA. The anode current iA and the gate voltage VG of the FCTm, the voltage $V_{AK1}$ applied across the anode and the cathode of FCTg, the gate voltage $V_{G1}$ thereof and the control input voltage $VG_{ON}$ applied across the base and the emitter of the transistor TR which take part in the operations of the control circuit described above are illustrated in FIG. 6 in consideration of phase relations among these voltages and current. As can be seen from FIG. 6, it is sufficient that the transistor TR is turned on by applying the control input voltage $VG_{ON}$ thereto only during the period in which the anode current iA is required to flow. In other words, the control circuit shown in FIG. 5 is well suited for use in applications where the anode current iA has to be in the form of a one-shot pulse of a relatively short duration or pulse current of a low repetition frequency.

Figure 7:
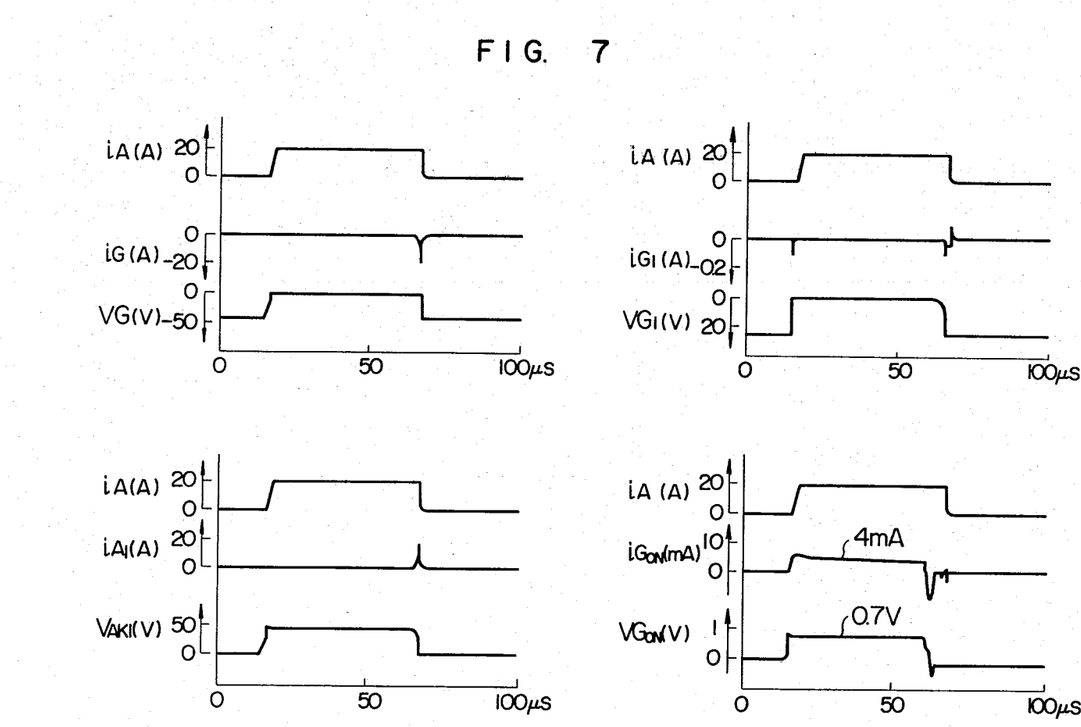
FIG. 7 shows signal waveforms actually measured at various circuit points of the control circuit shown in FIG. 5.
Figure 8:
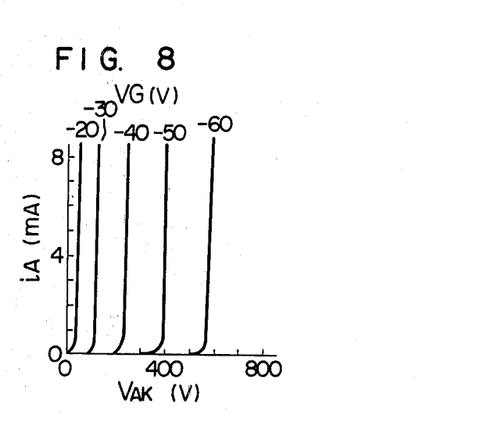
FIG. 8 illustrates graphically the voltage ($V_{AK}$)-current(iA) characteristics of FCT with gate voltage (VG) used as a parameter.

FIG. 7 illustrates waveforms of voltages and currents actually measured at the corresponding circuit points in the FCT control circuit shown in FIG. 5. For the measurement, the voltage of the main power source $E_S$ is selected equal to 100 V, the gate source voltage $E_{G1}$ of FCTg is equal to $-24$ V, and the gate source voltage $E_G$ is equal to $-40$ V. The load resistor $R_L$ is equal to 5Ω, while the adjusting register Rg of 3 kΩ is employed. The gate source voltages $E_G$ and $E_{G1}$ are determined in the following manner. For a given voltage value of the main power source $E_S$, the gate voltage $E_G$ required for blocking the main power source voltage $E_S$ is determined on the basis of the forwardly blocking voltage-current characteristics of FCTm. For example, when $E_S = 100$ V, i.e. the voltage $V_{AK}$ applied across the anode and the cathode of FCTm is substantially equal to 100 V, then the gate voltage Eg ≦ $-30$ V as determined from the forwardly blocking voltage-current characteristics shown in FIG. 8. The gate source voltage $E_{G1}$ required for cutting off the gate source voltage $E_G$ can also be determined from the characteristic curves shown in FIG. 8. For example, when $E_G = -40$ V, i.e. $V_{AK1} = 40$ V, then $E_{G1} ≦ -20$ V. In this manner, the FCT control circuit shown in FIG. 5 allows FCTm to be controlled with a low gate voltage. Further, by virtue of the transistor TR connected between the gate and the cathode of FCTg, it is possible to switch on and off a large anode current iA on the order of 20 A with a relatively small control input pulse (e.g. $VG_{ON}=0.7$ V or $iG_{ON}=4$ mA). The current amplification factor $iA/iG_{ON}$ in this case will amount to 5000 (=20 A/4 mA). The control power is as small as 2.8 mW.

Figure 9:
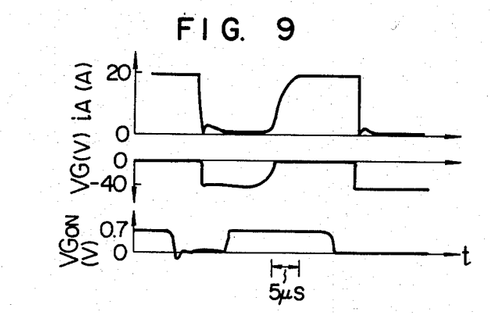
FIG. 9 is a signal waveform diagram illustrating a switching characteristic of the FCT control circuit according to an embodiment of the invention.

The FCT control circuit according to the teaching of the invention in which the main FCT (FCTm) is controlled by another FCT (FCTg) is advantageous over the hitherto known control circuit including conventional switching elements such as thyristors, GTO's, transistors in that a large load current can be switched on and off with a small control current or voltage. FIG. 9 shows waveforms of a load current (anode current) iA together with the control voltage $VG_{ON}$ and the gate voltage VG when the load current is turned on and off at a high frequency on the order of 40 KHz. It can be seen that the switching of the load current at a high frequency can be easily attained with a small control input voltage. The leading and trailing edges of the gate voltage VG are delayed relative to those of the control input voltage $VG_{ON}$, which is ascribable to the turn-on/off characteristic of the control transistor TR. In the FCT control circuit shown in FIG. 5, the gate current iG will also flow through the control FCT at the time when the main FCT, is turned off. However, since the control FCT operates then as a diode, even a pulse current having a high peak value would never bring about a local current concentration which would lead to thermal destruction of the control FCT. To the contrary, the conventional switching elements such as thyristors, GTO's, transistors or the like are susceptible to the thermal destruction due to the local concentration of the gate current.

As a modification of the control circuit shown in FIG. 5, it is possible to insert alternatively the control FCT at a position indicated in the phantom line to similar effect. Further, a plurality of the control FCT's may be connected in series to one another in the gate circuit of the main FCT so that the ON-OFF control of the main FCT may be effected in dependence on a logical product of various control signals applied separately to the individual control FCT's. Although the foregoing description has been made such that the control FCT inserted in the gate circuit of the main FCT has the transistor TR connected in series to the gate of the control FCT, the invention can be equally implemented in such circuit configuration that the gate pulse voltage $V_{G1}$ is directly applied across the gate and the cathode of the control FCT, provided that the gate voltage $V_{G1}$ of the control FCT required for blocking the voltage $E_G$ of the gate source is low (e.g. lower than about 10 V). Besides, in place of the transistor TR, it is equally possible to insert in the gate circuit of the control FCT another element such as a field effect transistor which is capable of varying the impedance in dependence on the control signal.

Figure 10:
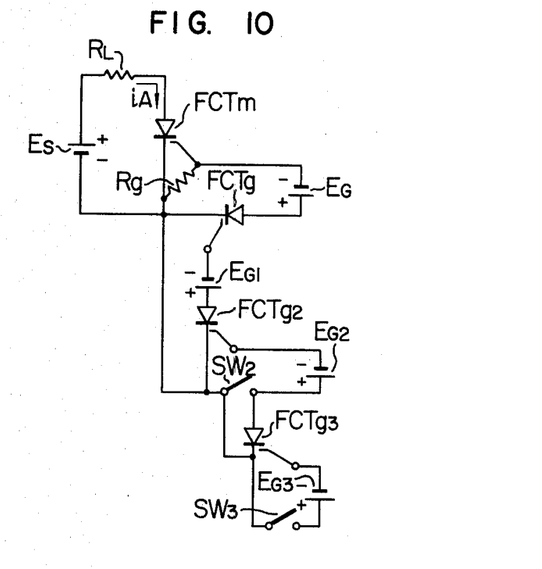
FIG. 10 is a circuit diagram to show another embodiment of the invention.

FIG. 10 is a circuit diagram showing the FCT control circuit according to another embodiment of the invention in which the control transistor TR in the ECT control circuit is replaced by a second control FCT designated by $FCT_{g2}$, wherein a third control FCT designated by $FCT_{g3}$ as well as a gate voltage source $E_{G2}$ and a switch SW$_2$ are inserted in series with one another in the gate circuit of $FCT_{g2}$. $FCT_{g3}$ is in turn controlled by a gate voltage source $E_{g3}$ and a switch SW$_3$ connected in series between the gate and the cathode of $FCT_{g3}$. It will be appreciated that the gate control circuit for FCTm implemented in a plurality of control stages allows the control input voltage to be decreased. In other words, FCTm can be turned on and off with a smaller control power input, whereby a correspondingly increased current amplification factor can be attained.

Figure 11:
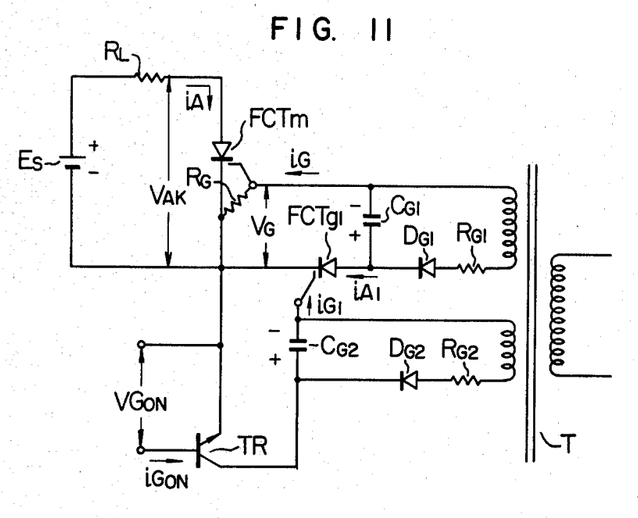
FIG. 11 is a circuit diagram to show still another embodiment of the invention.

FIG. 11 shows still another embodiment of the invention which differs from those described above in that rectifier circuits are employed as the control power sources. In this control circuit, the backward bias power source $E_G$ shown in FIG. 1 is replaced by a parallel connection of a smoothing capacitor $C_{G1}$ and a rectifier diode $D_{G1}$ connected to a transformer T through a resistor $R_{G1}$, while the power source $E_{G1}$ shown in FIG. 5 is replaced by a parallel connection of a smoothing capacitor $C_{G2}$ and a rectifier diode $D_{G2}$ connected to a transformer T through a resistor $R_{G2}$. In this control circuit shown in FIG. 11, when $FCT_m$ is in the non-conductive state with the transistor TR being non-conductive while $FCT_{g1}$ being conductive because of absence of the control input $V_{GON}$, the capacitor $C_{G2}$ is charaged. Thus, when the transistor TR is turned on, electric charge stored in the capacitor $C_{G2}$ is instantly discharged and supplied to $FCT_{g1}$ as a rush current, which means that a backward bias voltage exhibiting a steep rise is applied between the cathode and the gate of $FCT_{g1}$, whereby $FCT_{g1}$ is turned off without fail. Thus, the anode current iA through $FCT_m$ may ultimately rise up rapidly. A similar phenomenon takes place in the gate-cathode circuit of $FCT_m$. Since the capacitor $C_{G1}$ is charged when $FCT_{g1}$ is in the non-conductive state with $FCT_m$ being conductive, electric charge stored in the capacitor $C_{G1}$ is instantaneously discharged as a rush current, producing a large backward bias voltage having a steep rise applied across the gate and the cathode of $FCT_m$ which can thus be turned off positively without delay. In addition to the advantage that FCTm can be positively and rapidly turned on and off as described above, the control circuit shown in FIG. 11 is advantageous in that a commercial power supply can be utilized through the transformer T and that the control device can be implemented inexpensively in a miniature size. It will be noted that, once $FCT_m$ has been turned off, the non-conductive state thereof can be sustained by applying only a relatively small current to the gate resistor $R_g$, since the internal resistance of $FCT_m$ is increased in the non-conductive state.

Figure 12:
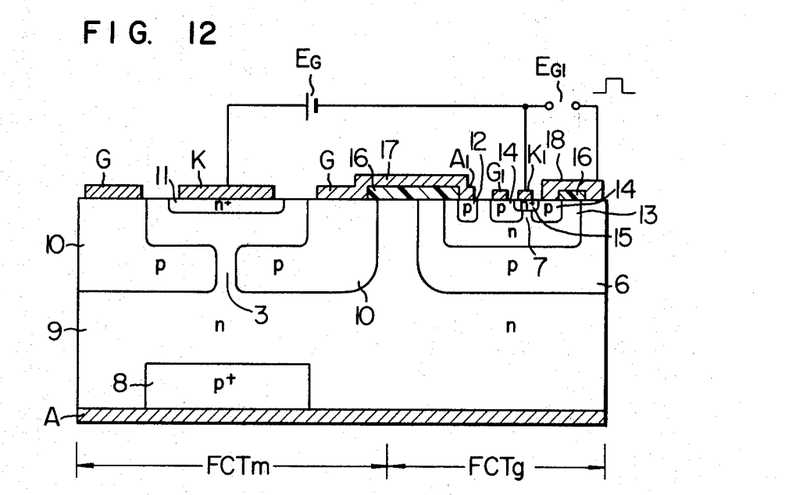
FIG. 12 is a vertical sectional view of a semiconductor FCT control device according to an embodiment of the invention which implements the circuit shown in FIG. 5.
Figure 13:
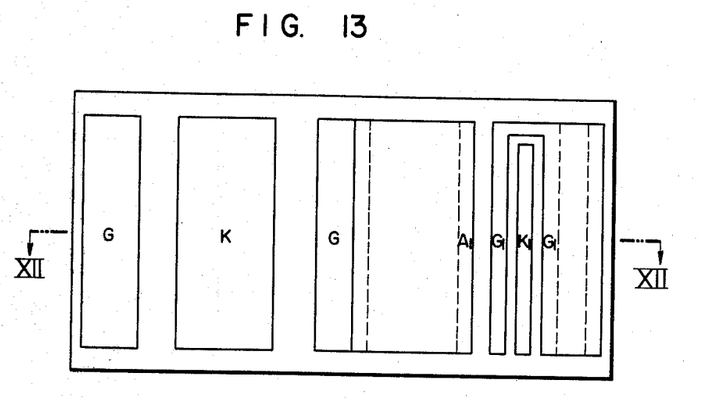
FIG. 13 is a top plan view of the same.

FIG. 12 shows in a cross-sectional view a structure of a monolithic semiconductor wafer in which $FCT_m$ and $FCT_g$ of the control circuit shown in FIG. 5 are formed. $FCT_g$ corresponds to the one shown in the phantom line. FIG. 13 is a top plan view of the same the cross section taken along line XII–XII' of which corresponds to FIG. 12. In these figures, symbols A, K and G denote the anode, cathode and gate electrodes of $FCT_m$, respectively, while A$_1$, K$_1$, G$_1$ represent the anode, cathode and gate electrodes of $FCT_g$, respectively. The main field controlled thyristor $FCT_m$ is composed of p+-anode region 8, n-semiconductor substrate region 9, p-gate region 10 and n+-cathode region 11. More particularly, when the n+-cathode region 11 is observed as being projected onto the p+-anode region 8, the p-gate region 10 is so located as to be partially overlapped with the n+-cathode region 11 and the p+-anode region 8.

On the other hand, $FCT_g$ is realized in an island formed in the substrate 9 by a p-layer 6 and is composed of a p-anode region 12, n-region 13, p-gate region 14 and n+-cathode region 15. Numeral 16 denotes an insulation layer, 17 denotes a conductor layer for connecting the gate electrode G of FCT$_m$ to the anode A$_1$ of FCT$_g$ and numeral 18 denotes a lead-out conductor from the gate electrode G$_1$.

When a voltage E$_{G1}$ is applied across the gate G$_1$ and the cathode K$_1$ of FCT$_g$, the n-type channel 7 formed immediately below the n$^+$-cathode region 15 is electrically pinched off, resulting in a high impedance state of FCT$_g$. On the other hand, since the gate voltage source E$_G$ for FCT$_m$ is shared by FCT$_g$, the absolute value of the gate voltage $|V_G|$ applied to FCT$_m$ becomes substantially equal to zero. Thus, FCT$_m$ is turned on. When the gate voltage E$_{G1}$ of FCT$_g$ is removed, FCT$_g$ is turned on, thereby to apply the gate voltage E$_G$ across the gate and the cathode of FCT$_m$. Consequently, the n-channel 3 formed below the n$^+$-cathode region is electrically pinched off to turn off FCT$_m$. With this arrangement, a switching device of a small size can be attained inexpensively. It will be self-explanatory that the transistor TR shown in FIG. 5 is also formed in the same semiconductor wafer. Further, when a plurality of the structures such as shown in FIGS. 12 and 13 are formed in a single semiconductor wafer in parallel connection with one another, a switching device of a large capacity can be accomplished.

Figure 4:
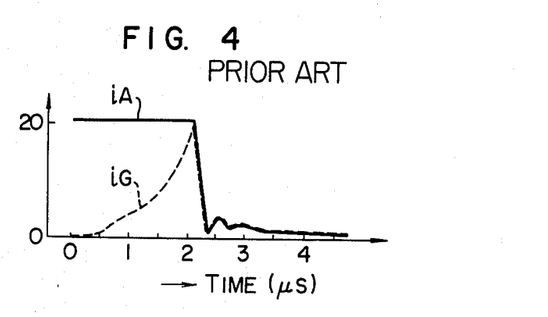
FIG. 4 shows graphically a relationship between an anode current and a gate current of an FCT at the time when the FCT is turned off.

In the control device shown in FIG. 12, FCT$_g$ will be still operative even when the isolating p-layer 6 is omitted. However, a field effect transistor or FET structure will then be formed by the anode A of FCT$_m$ and the cathode K$_1$ and gate G$_1$ of FCT$_g$. In such case, when the current path between the cathode K$_1$ and the gate G of FCT$_g$ is opened, the anode current will flow through the FET structure. Accordingly, even when FCT$_m$ is switched in the non-conductive state by opening the K$_1$-G$_1$ path of FCT$_g$, the voltage applied between the anode and the cathode of FCT$_m$ cannot be blocked. In this manner, the p-layer 6 plays an important role in preventing a failure in the turn-off operation due to the current iG flowing through the gate circuit (FIG. 4). Further, since the p-layer is at a potential equal to that of the p-gate region 14, a wide depletion layer will be formed in the n-region 13 sandwiched between the p-regions 6 and 14 upon application of the backward bias voltage between the electrodes K$_1$ and G$_1$, whereby a higher impedance state can be established at FCT$_g$. Further, when the depths of p-layer 6, p-region 10 and n$^+$-regions 11 and 15 are designed to be equal to one another, these regions can be formed under the same conditions through a diffusion process. Thus, FCT$_m$ and FCT$_g$ can be advantageously implemented in a single wafer without requiring a large number of processing steps.

In the control device shown in FIG. 12, when FCT$_g$ is to be realized in a vertical structure the main current path of which is perpendicular to the major surfaces of the wafer. The lead conductor 17 may be connected to the p-layer 6 while the lead conductor 18 contacted to the p-layer 6 and the p-region 12 are removed. However, in the case of the vertical structure of FCT$_g$, the gate current iG (FIG. 4) flowing through the gate circuit upon turn-off operation will then constitute a base current for a npn-transistor formed between the anode A and the cathode K$_1$ with the p-layer 6 serving as the base, and possibly involve failure in the turn-off operation.

The important feature of the switching control device shown in FIG. 12 resides in that the p-anode region 12, n-region 13, p-gate region 14 and n$^+$-cathode region 15 cooperate with one another so as to be operative as a thyristor as a whole. With such an arrangement, the space between the p-layer 6 and p-gate region 14 as well as the channel width defined by the distance between the p-gate region 14 can be narrowed to less than 10 $\mu$m, thereby to set the gate voltage required to turn off FCT$_g$ at a value smaller than 10 V while assuring the cutting-off of a large load current. Notwithstanding of the narrowed channel width, current can flow through the thyristor. Thus, the current through the FCT$_g$ does not decrease.

Figure 14:
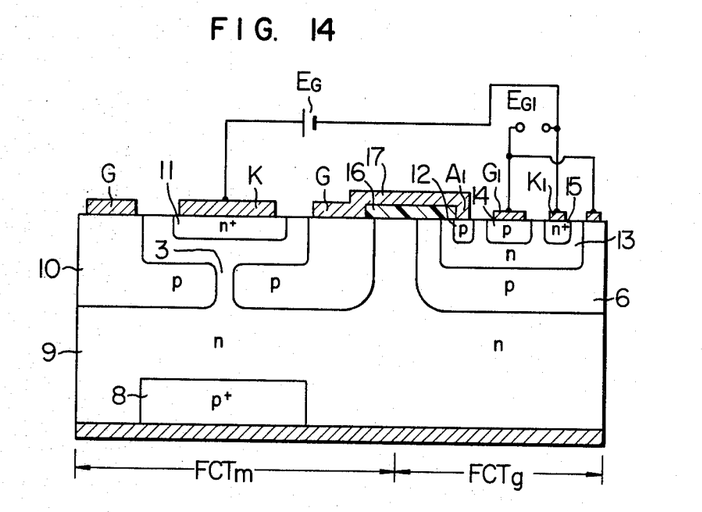
FIG. 14 is a view similar to FIG. 12 and shows another embodiment of the invention.

FIG. 14 is a view similar to FIG. 12 and shows another embodiment of the switching control device according to the invention. In FIGS. 12 and 14, same reference symbols and numerals denote same parts. As will be readily understood by comparing these figures, the structure shown in FIG. 14 differs from the one shown in FIG. 12 only in the structure of FCT$_g$ without involving any appreciable modifications in operation and effect. It should be mentioned that, in the case of the structure shown in FIG. 14, the backward bias voltage is applied across the cathode K$_1$ and the gate G$_1$ to form a depletion layer in the n-channel region enclosed by the p-layer 6 and the p-gate region 14 thereby to set FCT$_g$ in the blocked or non-conductive state. It will be noted that FCT$_m$ is implemented in a vertical array in both devices shown in FIGS. 12 and 13 so as to be able to handle a relatively large current.

Figure 15:
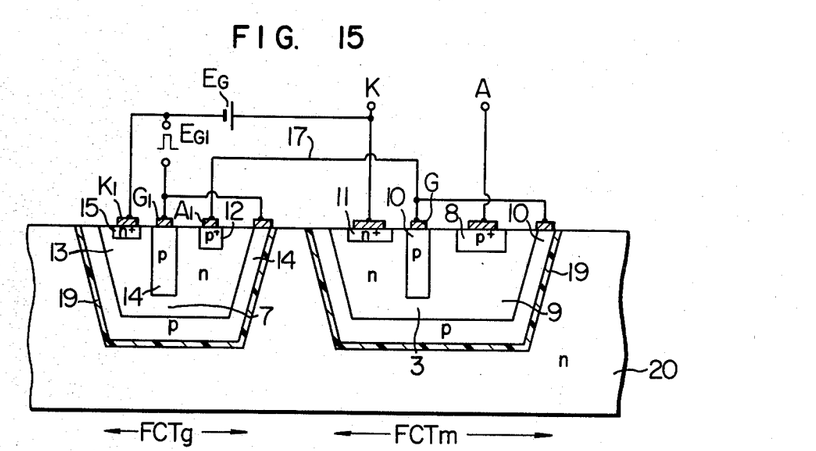
FIG. 15 is a view similar to FIG. 12 and shows a semiconductor FCT control device according to still another embodiment of the invention.
Figure 16:
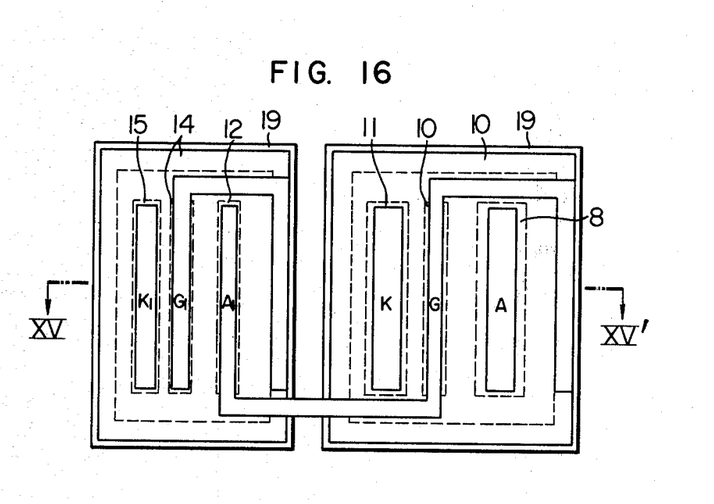
FIG. 16 is a top plan view of the same.

FIG. 15 shows still another embodiment of the invention in a view similar to FIG. 12. FIG. 16 in a top plan view, the cross section taken along line XV–XV' of which corresponds to FIG. 15. A characteristic feature of the switching control device shown in FIG. 15 resides in that FCT$_m$ and FCT$_g$ are implemented in respective islands which are isolated from one another in a semiconductor substrate 20 by respective isolating layers 19. This structure provides an advantage that all the wirings as required can be made only at one main surface of the semiconductor wafer. This device is suited for handling a small current. In this embodiment, p$^+$-anode regions 8, 12, a part of p-gate regions 10, 14 and n$^+$-cathode regions 11, 15 are formed so as to be spaced in parallel apart from each other in the respective islands. P-semiconductor regions are formed in the respective islands which become a part of the gate region. The main currents in such structure flow from the p$^+$-anode regions 8, 12 to the n$^+$-cathode regions 11, 15 through channels 3 and 7, respectively. When a predetermined gate voltage is applied between the gate and cathode region, the channels 3 and 7 will be pinched off to form depletion layers, respectively thereby to cut off the main currents.

Figure 17:
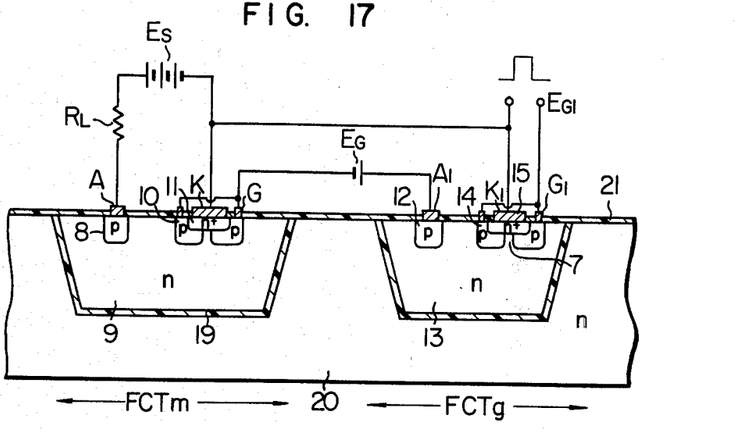
FIG. 17 is a view similar to FIG. 12 and shows a further embodiment of the invention.
Figure 18:
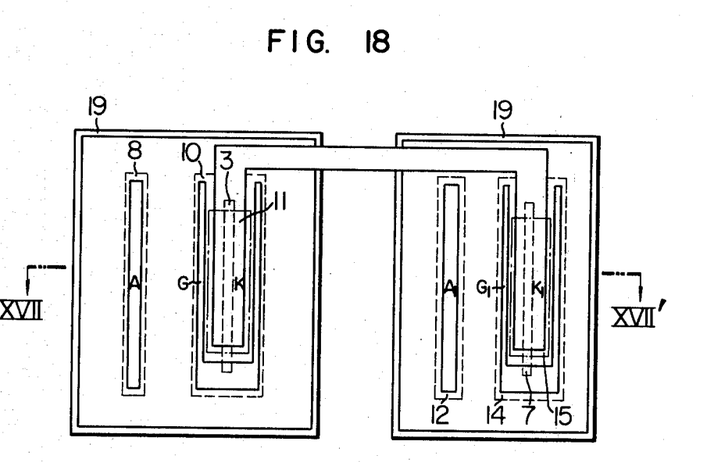
FIG. 18 is a top plan view of the same.

FIG. 17 is a sectional view to show a further embodiment of the switching-control device according to the invention. FIG. 18 is a top plan view of the same, the cross section taken along line XVII–XVII' in which corresponds to FIG. 17. P-anode regions 8 and 12 are formed in n-type monolithic crystal well regions 9 and 13, which are isolated from one another in the semiconductor substrate 20 by respective isolating layers 19, respectively. P-gate regions 10 and 14 define respective n-channel regions 3 and 7 and cooperate with respective n$^+$-cathode regions 11 and 15 so as to operate as field controlled switching elements, respectively. 21 designates an oxide film, which is omitted in FIG. 18 for simplicity of the figure. In this structure, each of the switching elements incorporates therein a thyristor structure and a diode structure connected in parallel thereto between the anode region and the cathode region. The switching control device shown in FIG. 16 thus can handle a large current with a narrowed width of the channel regions 3 and 7. In this embodiment, the main current flowing path comprises a diode portion from the p+-anode regions 8, 12 to the n+-cathode regions 11, 15 through the channels 3, 7 and a thyristor portion from the p+-anode regions 8, 12 to the n+-cathode regions 11, 15 through the p-gate regions 10, 14.

Incidentally, in the embodiments of FIGS. 16 and 18, anode, gate and cathode electrodes are directly contacted with only exposed portions of the respective anode, cathode and gate regions and extend onto the oxide film formed on the semiconductor substrate at the other portion (for example, a portion bridging between $FCT_m$ and $FCT_g$).

For fabricating the devices shown in FIGS. 15 and 17, a diffusion process or ion implantation process may be adopted for forming junctions. Further, the channel width can be adjusted with high precision by selecting correspondingly the mask pattern employed in the selective diffusion step. In consideration of the fact that the formation of the island or well regions 9 and 13 with a precise depth will encounter difficulty in the insulation-isolated structure of junction-isolated structure, the possibility of defining the channel width with an improved precision in the control device shown in FIG. 17 provides a great advantage over the structure shown in FIG. 15. Further, the switching elements $FCT_m$ and $FCT_g$ can be simultaneously realized through the utterly identical fabrication process in both the switching control devices shown in FIGS. 15 and 17. This means that a desired number of the switching control structures such as shown in FIGS. 15 and 17 can be formed simultaneously in a monolithic semiconductor substrate in desired combinations in the form of a so-called integrated circuit. In such case, isolation among the individual switching elements formed in the single semiconductor wafer can be accomplished by suitable isolating technique such as isolation by pn-junction, air or the like in addition to the dielectric isolation shown in FIG. 17. In the illustrated devices, the anode regions 8 and 12 as well as the cathode regions 11 and 15 are shown as being provided each in the individual switching element FCT. It will be noted that the planar array of these electrodes may be varied of modified. For example, the anode region 8 may be so formed as to surround the cathode region 11 and the gate region 10. In this case, the anode region 8 will make appearance at both sides of the cathode region and the gate region as viewed in a vertical cross-section. Further, areas of the anode regions 8 and 12 and the cathode regions 11 and 15 of $FCT_m$ and $FCT_g$ will vary in dependence on the circuit designs and operating conditions as required. Of course, the planar array of these regions may also be varied. These modifications and variations as well as design choices may be carried out without departing from the spirit and scope of the invention.

As will be appreciated from the foregoing description, the switching control devices according to the invention bring about many advantages as follows;

(1) It is possible to turn on and off a large load current by a main FCT with a control current or voltage of a relatively small magnitude.

(2) By virtue of the fact that the application of the control signal is required only during the period in which FCT is in an on-state, the device according to the invention is well suited for the control of a pulse current having a small duty ratio.

(3) Control of a high frequency pulse current can be easily accomplished.

(4) Due to the feature that the control FCT is used as the switching element in the gate circuit for the main FCT, a pulse-like load current flowing through the gate circuit upon turning off the main FCT will not lead to destruction of the switching element or the control FCT.

We claim:

1. A field controlled thyristor (FCT) circuit comprising:

(a) a first FCT which comprises a semiconductor substrate including a first emitter region of one conductivity type, a base region of said one conductivity type adjacent to said first emitter region, a second emitter region of opposite conductivity type to said one conductivity type and adjacent to said base region, and a gate region of said opposite conductivity type formed in said base region to provide a channel in said base region to form a current path between said first and second emitter region directly via said base region, a gate electrode connected to said gate region, a first main electrode connected to said first emitter region, and a second main electrode connected to said second emitter region, the first and the second main electrodes being provided for connection in series to a power source and a load;

(b) a first biasing means connected between said first main electrode and said gate electrode of said first FCT to apply a continuous reverse-bias to a junction formed between said first emitter region and said gate region in said semiconductor substrate of said first FCT for preventing a load current from flowing from said power source to said load through said first emitter region, said beam region including said channel, and said second emitter region of said first FCT by pinching off said channel with a depletion layer formed in said base region by said reverse-bias throughout a period when said reverse-bias is continuously applied to said first FCT so that said channel is continuously pinched off with said depletion layer;

(c) at least one second FCT which comprises a semiconductor substrate including a first emitter region of one conductivity type, a base region of said one conductivity type adjacent to said first emitter region, a second emitter region of opposite conductivity type to said one conductivity type and adjacent to said base region, and a gate region of said opposite conductivity type formed in said base region to provide a channel in said base region to form a current path between said first and second emitter region directly via said base region, a gate electrode connected to said gate region, a first main electrode connected to said first emitter region, and a second main electrode connected to said second emitter region, which the first and the second main electrodes are connected in series with said first biasing means, said first main electrode of said first FCT and said gate electrode of said first FCT; and (d) a gate control means connected between said first main electrode of said second FCT and said gate electrode of said second FCT, to apply a continuous reverse-bias to a junction formed between said first emitter region and said gate region in said semi-conductor substrate of said second FCT to pinch off said channel of said second FCT with a depletion layer formed in said base region for preventing said junction of the first FCT from being applied with said reverse-bias by said first biasing means throughout a period when said channel of said second FCT is pinched off so that said load current flows through said first FCT throughout a period when said reverse-bias by said gate control means is applied to said second FCT.

2. An FCT as set forth in claim 1 wherein said first biasing means comprises a parallel connection of a smoothing capacitor and a rectifier power source.

3. An FCT circuit as set forth in claim 1, wherein said gate control means comprises a second biasing means to apply the reverse-bias to said junction formed between said first emitter region of said second FCT and said gate region of said second FCT in said second FCT, and a switch means in series with said second biasing means.

4. An FCT circuit as set forth in claim 3, wherein said first biasing means and said second biasing means are pulse power sources.

5. An FCT circuit as set forth in claim 3, wherein said switch means comprises a semiconductor switching device.

6. An FCT circuit as set forth in claim 5, wherein said switch means comprises a circuit including a third FCT having a pair of main electrodes and a gate electrode, and a third biasing means connected to said pair of main electrodes of said third FCT in a series, whereby conduction between said pair of main electrodes of said third FCT is controlled with a gate signal applied between one of said pair of main electrodes of said third FCT and said gate electrode of said third FCT.

7. An FCT circuit as set forth in claim 5, wherein said switch means comprises a transistor having a gate electrode to which a gate signal is to be applied.

8. An FCT circuit as set forth in claim 1, wherein a resistor element is connected between the gate electrode and the first main electrode of said first FCT.

9. An FCT circuit as set forth in claim 3, wherein said second biasing means comprises a parallel connection of a smoothing capacitor and a rectifier power supply source.

10. An FCT circuit as set forth in claim 1 or 2, wherein said first FCT comprises a semiconductor substrate of a first conductivity type having a pair of major surfaces, a cathode region of said first conductivity type formed in said semiconductor substrate adjacent to one of said major surfaces and having a higher impurity concentration than that of said semiconductor substrate, an anode region of a second conductivity type opposite to said first conductivity type formed in said semiconductor substrate adjacent to the other of said major surfaces, a gate region comprising a region formed in said semiconductor substrate coplanar to said one major surface along said cathode region and extending from said one major surface toward the other major surface to a depth deeper than said cathode region, and another region connected to said region and including a flat portion which is partially covered by a projection of said cathode region projected onto said other major surface, and electrodes in ohmic contact with said cathode electrode, said anode electrode and said gate electrode, respectively.

11. An FCT circuit as set forth in claim 10, wherein said second FCT is formed together with said first FCT in one and the same semiconductor substrate and electrically isolated from said first FCT.

12. An FCT circuit as set forth in claim 11, wherein said second FCT is juxtaposed to said first FCT and comprises a cathode region of said first conductivity type having a higher impurity concentration than that of said semiconductor substrate and formed coplanar to said one major surface thereof, an anode region of said second conductivity type formed in said semiconductor substrate coplanar to said one major surface thereof, a gate region of said second conductivity type formed coplanar to said one major surface of said semiconductor substrate along said cathode region, electrodes in ohmic contact to said cathode region, said anode region and said gate region, respectively, and formed on said one major surface of said semiconductor substrate, and a semiconductor region of said second conductivity type formed coplanar to said one major surface so as to enclose said second FCT, thereby to electrically isolate said first and second FCT's from each other.

13. An FCT circuit as set forth in claim 12, wherein depth of said gate region of said first FCT relative to said one major surface is substantially equal to depth of said semiconductor region of said second conductivity type enclosing said second FCT, and wherein depth of said cathode region of said first FCT relative to said one major surface is substantially equal to the depth of said cathode region of said second FCT.

14. An FCT circuit as set forth in claim 1 or 2, wherein each of said first and second FCT's is formed in an island defined in a semiconductor substrate of one conductivity type having a pair of major surfaces by an insulation layer having an end portion exposed to one of said major surfaces, and wherein each of said first and second FCT's includes an anode region of the other conductivity type opposite to said first conductivity type, a cathode region having a higher impurity concentration than that of said semiconductor substrate and a gate region of said other conductivity type, said cathode, anode and gate regions of said first and second FCT's being formed coplanar to said one major surface each of said first and second FCT's having electrodes ohmic contacted to said anode region, said cathode region and said gate region, respectively.

15. An FCT circuit as set forth in claim 14 wherein said anode region, said cathode region and a part of said gate region are formed so as to be spaced in parallel apart from each other.

* * * * *